United States Patent
Snowdon et al.

(10) Patent No.: US 9,899,370 B2
(45) Date of Patent: Feb. 20, 2018

(54) AUXILIARY SELF-PROTECTING TRANSISTOR STRUCTURE

(71) Applicant: Fairchild Semiconductor Corporation, San Jose, CA (US)

(72) Inventors: Kenneth P. Snowdon, Falmouth, ME (US); Taeghyun Kang, Scarborough, ME (US); Alister Young, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 233 days.

(21) Appl. No.: 14/834,772

(22) Filed: Aug. 25, 2015

(65) Prior Publication Data

US 2016/0064920 A1 Mar. 3, 2016

Related U.S. Application Data

(60) Provisional application No. 62/044,056, filed on Aug. 29, 2014.

(51) Int. Cl.
*H01L 27/02* (2006.01)
(52) U.S. Cl.
CPC .................................. *H01L 27/027* (2013.01)
(58) Field of Classification Search
CPC .................................................... H01L 27/027
See application file for complete search history.

(56) References Cited

U.S. PATENT DOCUMENTS

| 7,179,691 B1* | 2/2007 | Lee ..................... H01L 27/0255 438/135 |
| 2004/0190209 A1* | 9/2004 | Jozwiak .............. H01L 27/0292 361/56 |
| 2011/0013325 A1* | 1/2011 | Kim .................... H01L 27/0274 361/56 |
| 2013/0082353 A1 | 4/2013 | Kuo et al. |

FOREIGN PATENT DOCUMENTS

CN 103427407 A 12/2013

* cited by examiner

*Primary Examiner* — Scott Bauer
(74) *Attorney, Agent, or Firm* — Brake Hughes Bellermann LLP

(57) ABSTRACT

This document discusses, among other things, an auxiliary self-protecting transistor circuit, system, and method configured to protect a complementary metal-oxide semiconductor (CMOS) transistor. The auxiliary self-protecting transistor circuit can include an ESD device including a gate terminal, a drain terminal, and a source terminal. The ESD device is configured to be coupled to an isolation region of a complementary metal-oxide semiconductor (CMOS) transistor, and can provide a discharge path between the isolation region of the CMOS transistor and the source terminal of the ESD device. The isolation region of the CMOS transistor can include a blocking junction, such as an n-doped isolation well (niso), a p-type well (pwell), or one or more other blocking junctions.

20 Claims, 3 Drawing Sheets

US 9,899,370 B2

AUXILIARY SELF-PROTECTING TRANSISTOR STRUCTURE

CLAIM OF PRIORITY

This application claims the benefit of priority under 35 U.S.C. § 119(e) of Kenneth P. Snowdon et al. U.S. Provisional Patent Application Ser. No. 62/044,056, titled "AUXILIARY SELF PROTECTING TRANSISTOR ESD STRUCTURE," filed on Aug. 29, 2014, which is incorporated by reference herein in its entirety.

BACKGROUND

Electrostatic discharge (ESD) is the sudden flow of charge between objects. In certain examples, ESD current can be large enough to damage electronic devices. To protect electronic devices from ESD events, various ESD protection circuits have been designed to shunt ESD current to ground.

OVERVIEW

This document discusses, among other things, an auxiliary self-protecting transistor circuit, system, and method configured to protect a complementary metal-oxide semiconductor (CMOS) transistor. The auxiliary self-protecting transistor circuit can include an ESD device including a gate terminal, a drain terminal, and a source terminal. The ESD device is configured to be coupled to an isolation region of a complementary metal-oxide semiconductor (CMOS) transistor, and can provide an ESD or surge discharge path between the isolation region of the CMOS transistor and the source terminal of the ESD device. The isolation region of the CMOS transistor can include a blocking junction, such as an n-doped isolation well (niso), a p-type well (pwell), or one or more other blocking junctions.

In an example, the ESD device can include an n-type metal-oxide semiconductor (NMOS) transistor, wherein the drain terminal of the NMOS transistor is configured to receive an ESD or surge event from the isolation region of the CMOS transistor and to discharge the ESD or surge event through the source terminal of the NMOS transistor to ground.

The CMOS transistor includes a gate terminal, a drain terminal, and a source terminal. In an example, the drain terminal of the ESD device is not coupled to the gate terminal, the drain terminal, or the source terminal of the CMOS transistor.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, an auxiliary self-protecting transistor electrostatic discharge structure (AES) and associated method. In an example, circuitry can be coupled to a complementary metal-oxide semiconductor (CMOS) transistor to better allow the transistor to withstand electrostatic discharge (ESD) events. In certain examples, the subject matter disclosed herein, when coupled to a transistor, can provide the transistor self-protecting characteristics similar to a much larger transistor, without loading or reducing the bandwidth of the transistor or circuits coupled to the transistor. The disclosed AES circuit can be attached to, among other things, a switch pass transistor, an output amplifier switching transistor, or one or more other circuits or transistors. Although the circuits, systems, and methods disclosed herein are described with respect to ESD events, they are likewise applicable to other surge events.

Figure 1:
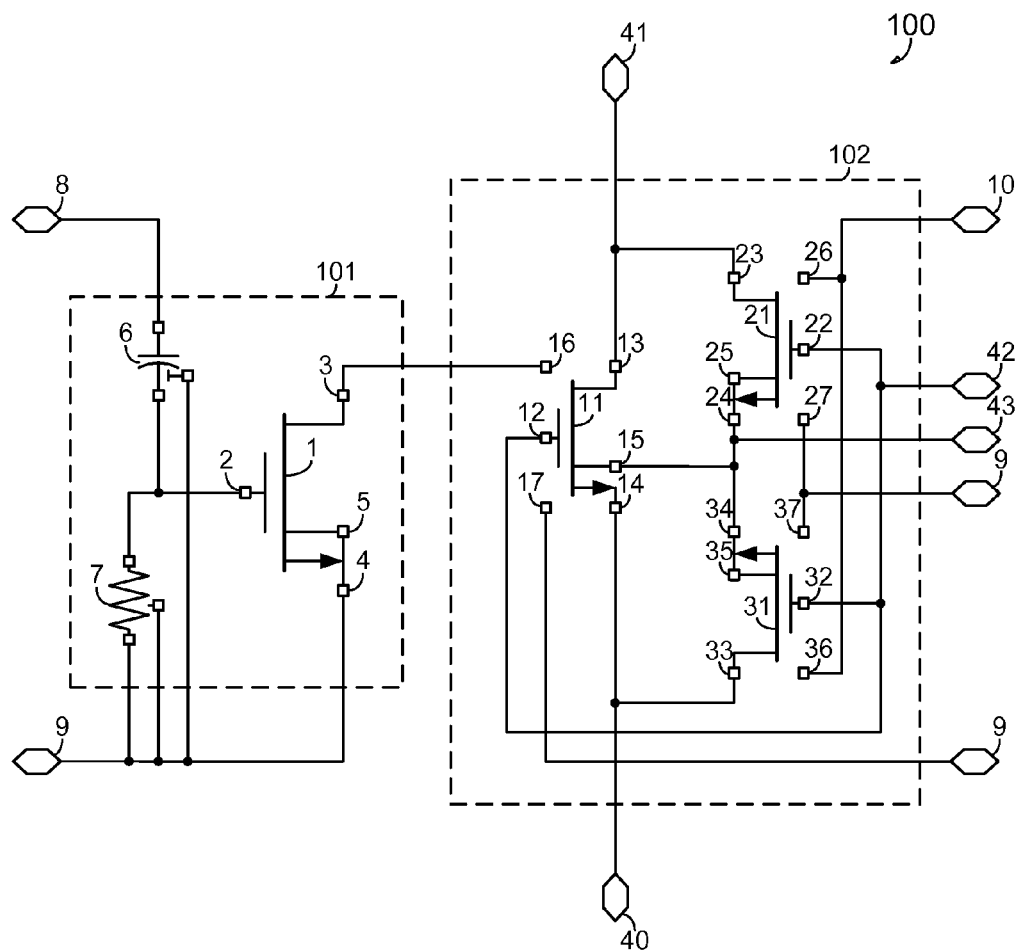
FIGS. 1-2 illustrate generally example auxiliary self-protecting transistor electrostatic discharge structure (AES).

FIG. 1 illustrates generally an example auxiliary self-protecting transistor electrostatic discharge (ESD) system 100, including an auxiliary self-protecting transistor ESD structure (AES) 101 configured to provide a discharge path from an isolation region of a complementary metal-oxide semiconductor (CMOS) transistor to ground through an ESD device 1, such as an n-type metal-oxide semiconductor (NMOS) transistor, having a gate terminal 2, a drain terminal 3, a source terminal 4, and a bulk terminal 5. In an example, the NMOS transistor 1 can include an isolated NMOS transistor.

In an example, the AES 101 can include a trigger circuit configured to provide a stimulus to the gate terminal 2 to initiate conduction between the drain terminal 3 and the source terminal 4 of the ESD device 1. The trigger circuit can include a voltage-based trigger, a transient RC trigger, or one or more other trigger circuits.

In the example of FIG. 1, the trigger circuit includes a capacitor 6 coupled between a voltage rail 8 and the gate terminal 2 of the ESD device 1, and a resistor 7 coupled between the gate terminal 2 of the ESD device 1 and ground 9. In an example, the bulk terminal 5 of the ESD device 1 can be coupled to the source terminal 4, and the source terminal 4 can be coupled to ground 9.

In an example, the capacitor 6 can include a three-terminal capacitor having a first terminal coupled to the voltage rail 8, a second terminal coupled to the gate terminal 2 of the ESD device 1, and a third terminal coupled to ground 9. The resistor 7 can include a three-terminal resistor (e.g., a three-terminal, semiconductor transistor used as a resistor) having a first terminal coupled to the gate terminal 2 of the ESD device 1, and second and third terminals coupled to ground 9.

In certain examples, the drain terminal 3 of the ESD device 1 of the AES 101 can be coupled to the isolation region of a CMOS transistor. The AES 101 of FIG. 1 is coupled to a switch pass transistor 102, including first, second, and third CMOS transistors 11, 21, 31, each having respective gate terminals 12, 22, 32, drain terminals 13, 23, 33, source terminals 14, 24, 34, and bulk terminals 15, 25, 35. The switch pass transistor 102 can include a first, low-impedance state configured to pass a signal between first and second external contacts 40, 41, and a second, high-impedance state configured to isolate the first and second external contacts 40, 41.

The first external contact 40 can be coupled to the source terminal 14 of the first CMOS transistor 11 and the drain terminal 33 of the third CMOS transistor 31. The second external contact 41 can be coupled to the drain terminals 13, 23 of the first and second CMOS transistors 11, 21.

In the example of FIG. 1, the gate terminals 12, 22, 32 of the first, second, and third CMOS transistors 11, 21, 31 are coupled to a first enable signal 42. The bulk terminals 15, 25, 35 of the first, second, and third CMOS transistors 11, 21, 31, and the source terminals 24, 34 of the second and third CMOS transistors 21, 31, are coupled to a second enable signal 43. In various examples, the first enable signal 42 can be the same as, or different from, the second enable signal 43, depending on the desired performance or characteristics of the switch pass transistor 102. In this example, the bulk terminal 15 of the first CMOS transistor 11 is not coupled to the source terminal 14 of the first CMOS transistor 11.

The first, second, and third CMOS transistors 11, 21, 31 each include respective n-doped isolation well (niso) connections 16, 26, 36, and substrate connections 17, 27, 37. The substrate connections 17, 27, 37 of the first, second, and third CMOS transistors 11, 21, 31 are coupled to ground 9.

In the example of FIG. 1, the niso connection 16 of the first CMOS transistor 11 of the switch pass transistor 102 is coupled to the AES 1. In an example, the niso connection 16 of the first CMOS transistor 11 is coupled to the drain terminal 3 of the ESD device 1 of the AES 1. The niso connections 26, 36 of the second and third CMOS transistors 21, 31 can be coupled to a first terminal 10. The first terminal 10 can include a positive voltage source, such as the voltage rail 8. In other examples, the first terminal 10 can be coupled to the AES 101, such as the drain terminal 3 of the ESD device 1, or the first terminal 10 can be coupled to one or more other AES devices, such as to protect the second or third CMOS transistors 21, 31, separately, or together with the first CMOS transistor 11.

During a positive voltage (V+) ESD or surge event, the drain terminal 13 or the source terminal 14 of the CMOS transistor 11 can go high enough that the drain/source-to-bulk junction of the CMOS transistor 11 can break down, triggering the AES 101, and providing a discharge path to ground 9.

Figure 2:
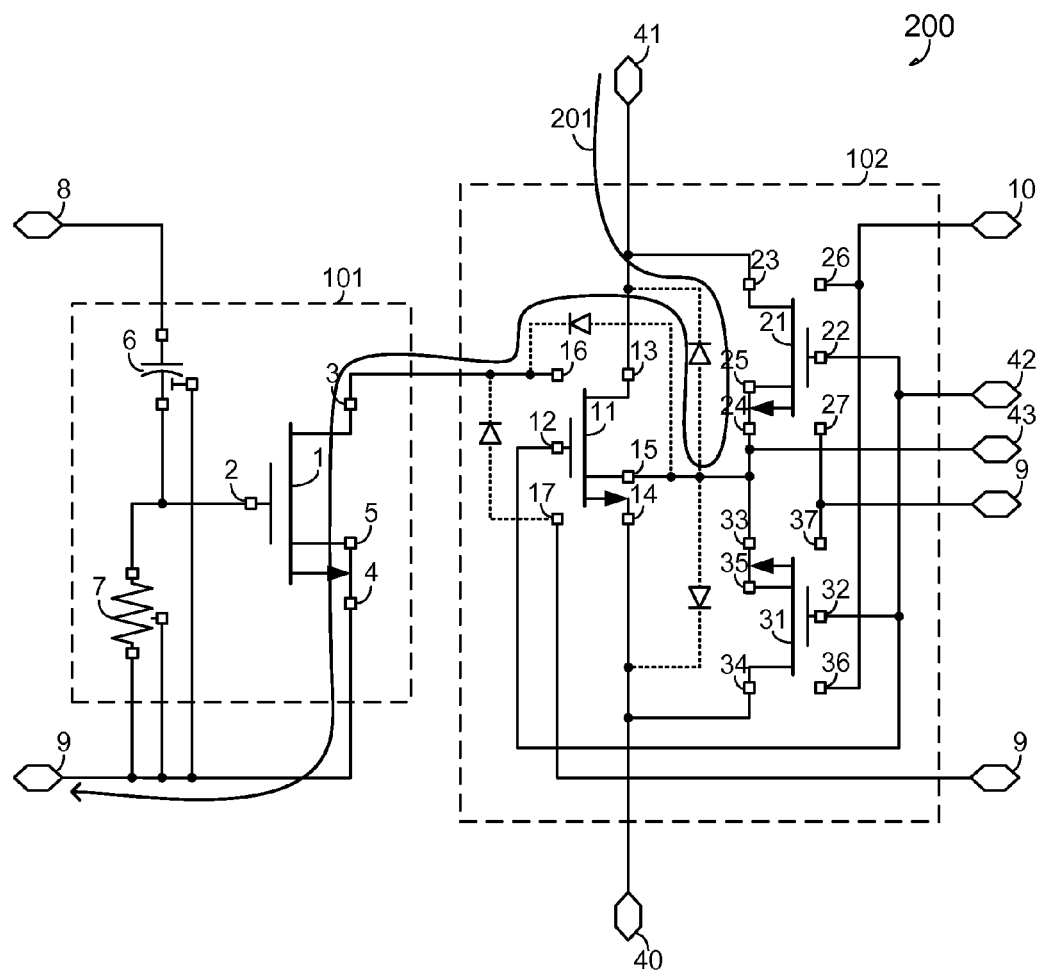

FIG. 2 illustrates generally an example auxiliary self-protecting transistor electrostatic discharge (ESD) system 200, such as disclosed in FIG. 1, illustrating intrinsic body diodes between terminals of the first CMOS transistor 11, and an example discharge path 201 from the second external contact 41 to ground 9 through the AES 101 during a V+ ESD or surge event. The AES 101 can use the breakdown characteristics of the first CMOS transistor 11 to discharge current from the drain terminal 13 or the source terminal 14 of the first CMOS transistor 11 to ground 9.

In this example, an ESD event can be dissipated using the n+ to p-epi breakdown resistance of the first CMOS transistor 11 and the ESD device 1. In an example, the discharge path 201 can pass from the second external contact 41 to ground 9 through a reverse-biased intrinsic diode (e.g., with a breakdown voltage about 10V, etc.) between the drain terminal 13 (n+) and the bulk terminal 15 (p-epi) of the first CMOS transistor 11, a forward-biased diode from the bulk terminal 15 (p-epi) to the niso connection 16, and the ESD device 1. In an example, the trigger voltage (VT1) threshold of the drain terminal 3 of the ESD device 1 can be about 7.8V.

Figure 3:
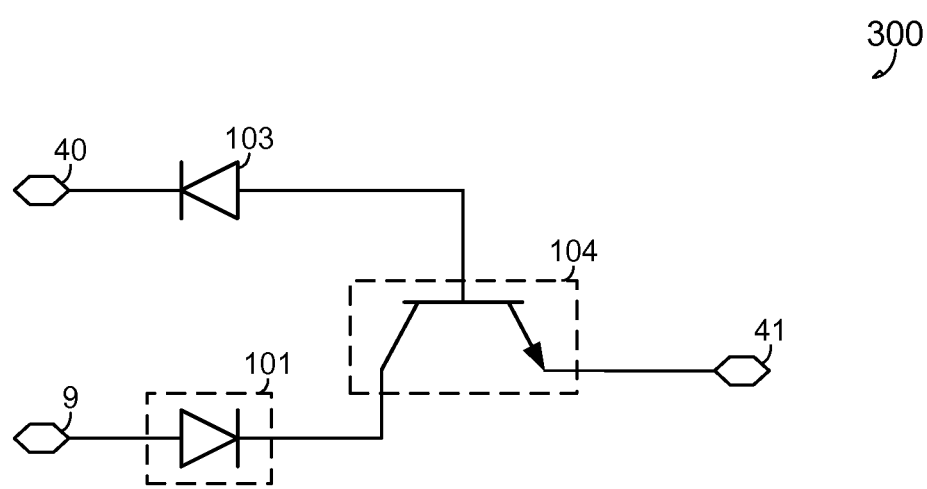
FIG. 3 illustrates generally example ESD event operation.

FIG. 3 illustrates generally example ESD event operation 300 for a negative voltage (V−) ESD or surge event at the drain terminal 13 of the first CMOS transistor 11. The intrinsic body diodes of the first CMOS transistor 11 are illustrated as a diode 103 and a bipolar junction transistor (BJT) 104 having a base, collector, and emitter. In this example, current can be supplied to the port under stress using two mechanisms.

The first mechanism can supply current from a first external contact 40 (e.g., a source terminal 14 of the first CMOS transistor 11) to the second external contact 41 (e.g., a drain terminal 13 of the first CMOS transistor 11) through the first CMOS transistor 11, including the reverse-biased diode 103 from the source terminal 14 of the first CMOS transistor 11 to the bulk terminal 15 of the first CMOS transistor 11 (e.g., p-epi, illustrated as the base of the BJT 104), and a forward-biased diode of the BJT 104 from the bulk terminal 15 of the first CMOS transistor 11 (e.g., the base of the BJT 104) to the drain terminal 13 of the first CMOS transistor 11 (e.g., the emitter of the BJT 104).

The second mechanism can supply current from ground 9 to the second external contact 41 through the AES 101 (e.g., the ESD device 1), illustrated as a forward-biased diode (e.g., from the coupled source and bulk terminals 4, 5 of the ESD device 1 to the drain terminal 3 of the ESD device 1), and the first CMOS transistor 11, illustrated as a reverse-biased diode of the BJT 104 from the niso terminal 16 of the first CMOS transistor 11 (e.g., the collector of the BJT 104) to the bulk terminal 15 of the first CMOS transistor 11 and a forward-biased diode of the BJT 104 from the bulk terminal 15 of the first CMOS transistor 11 (e.g., the base of the BJT 104) to the drain terminal 13 of the first CMOS transistor 11 (e.g., the emitter of the BJT 104). In an example, base current for the BJT 104 can be provided when the reverse-biased diode 103 breaks down.

ADDITIONAL NOTES AND EXAMPLES

In Example 1, an auxiliary self-protecting transistor circuit includes an electrostatic discharge (ESD) device including a gate terminal, a drain terminal, and a source terminal. The drain terminal of the ESD device is configured to be coupled to an isolation region of a complementary metal-oxide semiconductor (CMOS) transistor, and the ESD device is configured to provide a discharge path between the isolation region of the CMOS transistor and the source terminal of the ESD device to protect the CMOS transistor.

In Example 2, the circuit of Example 1 optionally includes a trigger circuit configured to provide a stimulus to the gate terminal of the ESD device to initiate conduction between the drain terminal and the source terminal of the ESD device.

In Example 3, the trigger circuit of any one or more of Examples 1-2 optionally includes a capacitor coupled between a voltage rail and the gate terminal of the ESD device, and a resistor coupled between the gate terminal of the ESD device and ground.

In Example 4, the ESD device of any one or more of Examples 1-3 optionally includes an n-type metal-oxide semiconductor (NMOS) transistor, wherein the drain terminal of the NMOS transistor is optionally configured to receive a surge event from the isolation region of the CMOS transistor and to discharge the surge event through the source terminal of the NMOS transistor to ground.

In Example 5, the isolation region of the CMOS transistor of any one or more of Examples 1-4 optionally includes a blocking junction, including at least one of an n-doped isolation well (niso) or a p-type well (pwell).

In Example 6, the CMOS transistor of any one or more of Examples 1-5 optionally includes a gate terminal, a drain terminal, and a source terminal, wherein the drain terminal of the ESD device of any one or more of Examples 1-5 is optionally not coupled to the gate terminal, the drain terminal, or the source terminal of the CMOS transistor.

In Example 7, the circuit of any one or more of Examples 1-6 optionally includes a pass gate, wherein the pass gate optionally includes the CMOS transistor, and wherein the ESD device of any one or more of Examples 1-6 is optionally configured to provide a discharge path to protect the pass gate from a surge event.

In Example 8, an auxiliary self-protecting transistor electrostatic discharge (ESD) system includes an ESD device having a gate terminal, a drain terminal, and a source terminal, and a complementary metal-oxide semiconductor (CMOS) transistor having a gate terminal, a drain terminal, a source terminal, and an isolation region. The drain terminal of the ESD device is coupled to the isolation region of the CMOS transistor, and the ESD device is configured to provide a discharge path between the isolation region of the CMOS transistor and the source terminal of the ESD device to protect the CMOS transistor.

In Example 9, the drain terminal of the ESD device of any one or more of Examples 1-8 is optionally not coupled to the gate terminal, the drain terminal, or the source terminal of the CMOS transistor.

In Example 10, the circuit of any one or more of Examples 1-9 optionally includes a trigger circuit configured to provide a stimulus to the gate terminal of the ESD device to initiate conduction between the drain terminal and the source terminal of the ESD device.

In Example 11, the trigger circuit of any one or more of Examples 1-10 optionally includes a capacitor coupled between a voltage rail and the gate terminal of the ESD device, and a resistor coupled between the gate terminal of the ESD device and ground.

In Example 12, the ESD device of any one or more of Examples 1-11 optionally includes an n-type metal oxide semiconductor (NMOS) transistor, wherein the drain terminal of the NMOS transistor is configured to receive a surge event from the isolation region of the CMOS transistor and to discharge the surge event through the source terminal of the NMOS transistor to ground.

In Example 13, the isolation region of the CMOS transistor includes a blocking junction, including at least one of an n-doped isolating well (niso) or a p-type well (pwell).

In Example 14, any one or more of Examples 1-13 optionally include a pass gate, wherein the pass gate optionally includes the CMOS transistor, wherein the ESD device of any one or more of Examples 1-13 is optionally configured to provide a discharge path to protect the pass gate from a surge event.

In Example 15, a method to provide auxiliary protection to a transistor includes coupling an isolation region of a complementary metal-oxide semiconductor (CMOS) transistor to a drain terminal of an electrostatic discharge (ESD) device, and providing a discharge path between an isolation region of the CMOS transistor and a source terminal of the ESD device to protect the CMOS transistor from a surge event.

In Example 16, any one or more of Examples 1-15 optionally includes providing a stimulus to a gate terminal of the ESD device using a trigger circuit to initiate conduction between the drain terminal and a source terminal of the ESD device.

In Example 17, the trigger circuit of any one or more of Examples 1-16 optionally includes a capacitor coupled between a voltage rail and the gate terminal of the ESD device, and a resistor coupled between the gate terminal of the ESD device and ground.

In Example 18, any one or more of Examples 1-17 optionally includes receiving a surge event from the isolation region of the CMOS transistor at the drain terminal of the ESD device, and discharging the surge event through a source terminal of the ESD device to ground, wherein the ESD device includes an n-type metal-oxide semiconductor (NMOS) transistor.

In Example 19, the isolation region of the CMOS transistor of any one or more of Examples 1-18 optionally includes a blocking junction including at least one of an n-doped isolation well (niso) or a p-type well (pwell). In an example, the blocking junction includes a niso. In another example, the blocking junction includes a pwell.

In Example 20, the CMOS transistor of any one or more of Examples 1-19 optionally includes a gate terminal, a drain terminal, and a source terminal, wherein the drain terminal of the ESD device of any one or more of Examples 1-19 is optionally not coupled to the gate terminal, the drain terminal, or the source terminal of the CMOS transistor.

In Example 21, a system or apparatus can include, or can optionally be combined with any portion or combination of any portions of any one or more of Examples 1-20 to include, means for performing any one or more of the functions of Examples 1-20, or a machine-readable medium including instructions that, when performed by a machine, cause the machine to perform any one or more of the functions of Examples 1-20.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An auxiliary self-protecting transistor circuit, comprising:
    an electrostatic discharge (ESD) device including a gate terminal, a drain terminal, and a source terminal, wherein the drain terminal of the ESD device is configured to be coupled to an isolation well of a complementary metal-oxide semiconductor (CMOS) transistor,
    wherein the ESD device is configured to provide a discharge path between the isolation well and the source terminal of the ESD device to protect the CMOS transistor.

2. The circuit of claim 1, including a trigger circuit configured to provide a stimulus to the gate terminal of the ESD device to initiate conduction between the drain terminal and the source terminal of the ESD device.

3. The circuit of claim 2, wherein the trigger circuit includes a capacitor coupled between a voltage rail and the gate terminal of the ESD device, and a resistor coupled between the gate terminal of the ESD device and ground.

4. The circuit of claim 1, wherein the ESD device includes an n-type metal-oxide semiconductor (NMOS) transistor, and
    wherein the drain terminal of the NMOS transistor is configured to receive a surge event from the isolation well and to discharge the surge event through the source terminal of the NMOS transistor to ground.

5. The circuit of claim 1, wherein the isolation well includes at least one of an n-doped isolation well (niso) or a p-type well (pwell).

6. The circuit of claim 1, wherein the CMOS transistor includes a gate terminal, a drain terminal, and a source terminal, and
    wherein the drain terminal of the ESD device is not coupled to the gate terminal, the drain terminal, or the source terminal of the CMOS transistor.

7. The circuit of claim 1, including a pass gate, wherein the pass gate includes the CMOS transistor, and
    wherein the ESD device is configured to provide a discharge path to protect the pass gate from a surge event.

8. An auxiliary self-protecting transistor electrostatic discharge (ESD) system, comprising:
    an ESD device including a gate terminal, a drain terminal, and a source terminal; and
    a complementary metal-oxide semiconductor (CMOS) transistor including a gate terminal, a drain terminal, a source terminal, and an isolation well,
    wherein the drain terminal of the ESD device is coupled to the isolation well,
    wherein the ESD device is configured to provide a discharge path between the isolation well and the source terminal of the ESD device to protect the CMOS transistor.

9. The system of claim 8, wherein the drain terminal of the ESD device is not coupled to the gate terminal, the drain terminal, or the source terminal of the CMOS transistor.

10. The system of claim 8, including a trigger circuit configured to provide a stimulus to the gate terminal of the ESD device to initiate conduction between the drain terminal and the source terminal of the ESD device.

11. The system of claim 10, wherein the trigger circuit includes a capacitor coupled between a voltage rail and the gate terminal of the ESD device, and a resistor coupled between the gate terminal of the ESD device and ground.

12. The system of claim 8, wherein the ESD device includes an n-type metal oxide semiconductor (NMOS) transistor, and
    wherein the drain terminal of the NMOS transistor is configured to receive a surge event from the isolation well and to discharge the surge event through the source terminal of the NMOS transistor to ground.

13. The system of claim 8, wherein the isolation well includes at least one of an n-doped isolating isolation well (niso) or a p-type well (pwell).

14. The system of claim 8, including a pass gate, wherein the pass gate includes the CMOS transistor, and
    wherein the ESD device is configured to provide a discharge path to protect the pass gate from a surge event.

15. A method to provide auxiliary protection to a transistor, comprising:
    coupling an isolation well of a complementary metal-oxide semiconductor (CMOS) transistor to a drain terminal of an electrostatic discharge (ESD) device; and
    providing a discharge path between the isolation well and a source terminal of the ESD device to protect the CMOS transistor from a surge event.

16. The method of claim 15, including providing a stimulus to a gate terminal of the ESD device using a trigger circuit to initiate conduction between the drain terminal and a source terminal of the ESD device.

17. The method of claim 16, wherein the trigger circuit includes a capacitor coupled between a voltage rail and the gate terminal of the ESD device, and a resistor coupled between the gate terminal of the ESD device and ground.

18. The method of claim 15, including:
receiving a surge event from the isolation well at the drain terminal of the ESD device; and
discharging the surge event through a source terminal of the ESD device to ground,
wherein the ESD device includes an n-type metal-oxide semiconductor (NMOS) transistor.

19. The method of claim 15, wherein the isolation well includes at least one of an n-doped isolation well (niso) or a p-type well (pwell).

20. The method of claim 15, wherein the CMOS transistor includes a gate terminal, a drain terminal, and a source terminal, and
wherein the drain terminal of the ESD device is not coupled to the gate terminal, the drain terminal, or the source terminal of the CMOS transistor.

* * * * *